(12) United States Patent
Xing

(10) Patent No.: US 10,353,261 B2
(45) Date of Patent: Jul. 16, 2019

(54) RGBW LIQUID CRYSTAL PANEL

(71) Applicant: Wuhan China Star Optoelectronics Technology Co., Ltd., Wuhan, Hubei (CN)

(72) Inventor: Zhenzhou Xing, Guangdong (CN)

(73) Assignee: Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 2 days.

(21) Appl. No.: 15/561,062

(22) PCT Filed: Sep. 21, 2017

(86) PCT No.: PCT/CN2017/102619
§ 371 (c)(1),
(2) Date: Sep. 24, 2017

(87) PCT Pub. No.: WO2019/028974
PCT Pub. Date: Feb. 14, 2019

(65) Prior Publication Data
US 2019/0049766 A1    Feb. 14, 2019

(51) Int. Cl.
*H01L 27/12* (2006.01)
*G02F 1/1368* (2006.01)
(Continued)

(52) U.S. Cl.
CPC ........ *G02F 1/1368* (2013.01); *H01L 27/1222* (2013.01); *G02F 1/134309* (2013.01);
(Continued)

(58) Field of Classification Search
None
See application file for complete search history.

(56) References Cited

U.S. PATENT DOCUMENTS 9,219,083 B1 * 12/2015 Zheng .................. H01L 27/124
2004/0080470 A1 * 4/2004 Yamazaki ............ G09G 3/3233
345/76
(Continued)

FOREIGN PATENT DOCUMENTS

| CN | 106200150 A | 12/2016 |
|---|---|---|
| JP | 2009122231 A | 6/2009 |
| JP | 2010002530 A | 1/2010 |

*Primary Examiner* — Andres Munoz
(74) *Attorney, Agent, or Firm* — Andrew C. Cheng

(57) ABSTRACT

The present application discloses a RGBW liquid crystal panel includes a plurality of scanning lines and a plurality of data lines, and a plurality of sub-pixel regions formed by the division of the plurality of scanning lines and the plurality of data lines; each sub-pixel region includes a sub-pixel and a thin film transistor, a gate electrode and a source electrode of each thin film transistor are connected to a scanning line and a data line, respectively, a drain electrode of each thin film transistor is connected to the sub-pixel; wherein, the plurality of sub-pixels includes a plurality of first white sub-pixels and a plurality of second white sub-pixels, the thin film transistor corresponding to the first white sub-pixel and the thin film transistor corresponding to second white sub-pixel have different channel width-length ratio, so that the first white sub-pixel and the second white sub-pixel have different luminance.

16 Claims, 3 Drawing Sheets

(51) Int. Cl.
    *G02F 1/1343*    (2006.01)
    *G02F 1/1362*    (2006.01)
    *H01L 29/786*    (2006.01)

(52) U.S. Cl.
    CPC ............. *G02F 1/136286* (2013.01); *G02F 2001/134345* (2013.01); *G02F 2201/52* (2013.01); *H01L 29/78696* (2013.01)

(56) References Cited

U.S. PATENT DOCUMENTS

| | | | |
|---|---|---|---|
| 2004/0207583 A1* | 10/2004 | Koo | H01L 27/12 345/82 |
| 2004/0211961 A1* | 10/2004 | Koo | H01L 27/1229 257/59 |
| 2007/0052634 A1* | 3/2007 | Yamazaki | G09G 3/3233 345/76 |
| 2008/0001527 A1* | 1/2008 | Koo | H01L 27/12 313/500 |
| 2012/0320297 A1* | 12/2012 | Itsumi | G09G 3/3648 349/43 |
| 2014/0253835 A1* | 9/2014 | Li | G02F 1/1343 349/42 |
| 2016/0035292 A1 | 2/2016 | Lee et al. | |
| 2016/0055820 A1 | 2/2016 | Chu Ke et al. | |
| 2017/0124948 A1 | 5/2017 | Minami | |

\* cited by examiner

RGBW LIQUID CRYSTAL PANEL

FIELD OF THE INVENTION

The present application relates to a liquid crystal display technology field, and more particularly to a RGBW liquid crystal panel.

BACKGROUND OF THE INVENTION

A white sub-pixels is added in a RGBW four-colors display technology on the basis of the RGW three primary colors, therefore the transmittance of the liquid crystal panel can be improved; in the same time, through the use of sub-pixel sharing algorithm in the premise of the same resolution can reduce ⅓ pixel number of the liquid crystal panel, to achieve reducing the fabricating yield risk of the ultra-high resolution, reducing the 40% power consumption of the backlight, at the same time, to improve the image contrast effect, so the RGBW liquid crystal panel has a broad space for development in the future.

However, the RGBW liquid crystal panel also has some inherent defects, such as the problem of darker in a pure color, for example, when is observed by a large viewing angle, the optical luminance curve cannot meet gamma 2.2, that is, color shift problem is occurred. The greater the viewing angle, the more obvious the color shift phenomenon.

FIG. 1 is a gamma curve of a liquid crystal panel at different viewing angles in the conventional technology. As shown in FIG. 1, when the viewing angle is the front viewing angle of 0°, the gamma value is 2.2. As the viewing angle changes from front viewing angle of 0° to the oblique angle of 30° and further to the oblique angle of 60°, the gamma curve corresponding to different viewing angles deviates from the gamma curve corresponding to the angle of 0°, the degree of the gamma curve corresponding gamma curve is more and more serious, such that it makes the color shift more and more obvious.

Therefore, how to improve darker in a pure color and the color shift the problems of the RGBW liquid crystal panel, and thus improve the display quality of the RGBW liquid crystal panel is an urgent problem to be solved.

SUMMARY OF THE INVENTION

The technical problem that the present application mainly solves is to provide an RGWB liquid crystal panel which can simultaneously improve the darker in a pure color and the color shift the problems of the RGBW liquid crystal panel.

In one aspect, a liquid crystal panel is provided. The liquid crystal panel includes multiple scanning lines and data lines perpendicular to and crossing over each other. The scanning lines and the data lines divide the liquid crystal panel into multiple sub-pixel regions. Each of the sub-pixel regions includes a sub-pixel and a thin film transistor. A gate electrode and a source electrode of the thin film transistor are connected to one of the scanning lines and one of the data lines. A drain electrode of the thin film transistor is connected to the sub-pixel. Sub-pixels of the multiple sub-pixel regions include a number of first white sub-pixels and a number of second white sub-pixels. The thin film transistor corresponding to each first white sub-pixel and the thin film transistor corresponding to each second white sub-pixel have different channel width-length ratio, so that the first white sub-pixels and the second white sub-pixels have different luminance. Channel width-length ratio of the thin film transistor corresponding to each first white sub-pixel is smaller than channel width-length ratio of the thin film transistor corresponding to each second white sub-pixel. The thin film transistor corresponding to each first white sub-pixel and the thin film transistor corresponding to each second white sub-pixel have same channel lengths, and a channel width of the thin film transistor corresponding to each first white sub-pixel is smaller than that of the thin film transistor corresponding to each second white sub-pixel. The sub-pixels of the multiple sub-pixel regions further include a number of red sub-pixels, a number of green sub-pixels and a number of blue sub-pixels. Channel width-length ratio of the thin film transistors corresponding to the red sub-pixels, the green sub-pixels and the blue sub-pixels are equal to the channel width-length ratio of the channel width-length ratio of the thin film transistor corresponding to each of the second white sub-pixels.

In another aspect, a liquid crystal panel is provided. The liquid crystal panel includes multiple scanning lines and data lines perpendicular to and crossing over each other. The scanning lines and the data lines divide the liquid crystal panel into multiple sub-pixel regions. Each of the sub-pixel regions includes a sub-pixel and a thin film transistor. A gate electrode and a source electrode of the thin film transistor are connected to one of the scanning lines and one of the data lines. A drain electrode of the thin film transistor is connected to the sub-pixel. Sub-pixels of the multiple sub-pixel regions include a number of first white sub-pixels and a number of second white sub-pixels. The thin film transistor corresponding to each first white sub-pixel and the thin film transistor corresponding to each second white sub-pixel have different channel width-length ratio, so that the first white sub-pixels and the second white sub-pixels have different luminance.

The advantageous effect of the present application is that the plurality of sub-pixels in the RGBW liquid crystal panel of the present application include a first white sub-pixel and a plurality of second white sub-pixels, wherein the thin film transistors corresponding to the first white sub-pixels and the thin film transistors corresponding to and the second white sub-pixels have different channel width-length ratios, such that the first white sub-pixels and the second white sub-pixels have different luminance. In the above-described manner, the present application can simultaneously improve the darker in a pure color and the color shift problems of the RGBW liquid crystal panel, thereby improving the display quality of the liquid crystal panel.

BRIEF DESCRIPTION OF THE DRAWINGS

In order to more clearly illustrate the embodiments of the present application or prior art, the following FIG.s will be described in the embodiments are briefly introduced. It is obvious that the drawings are merely some embodiments of the present application, those of ordinary skill in this field can obtain other FIG.s according to these FIG.s without paying the premise.

DETAILED DESCRIPTION OF PREFERRED EMBODIMENTS

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of ordinary skill in the premise of no creative efforts acquired should be considered within the scope of protection of the present application.

Specifically, the terminologies in the embodiments of the present application are merely for describing the purpose of the certain embodiment, but not to limit the invention.

The present application will now be described in further detail with reference to the accompanying drawings and preferred embodiments.

Figure 1:
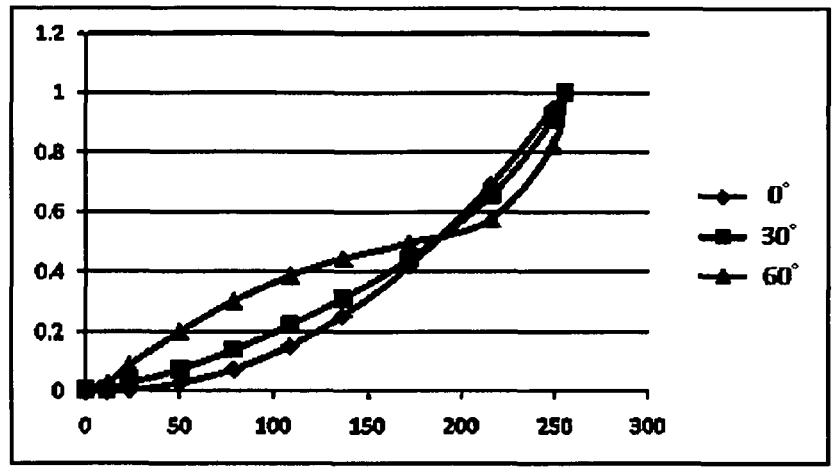
FIG. 1 is a gamma curve of a liquid crystal panel at different viewing angles in the conventional technology.
Figure 2:
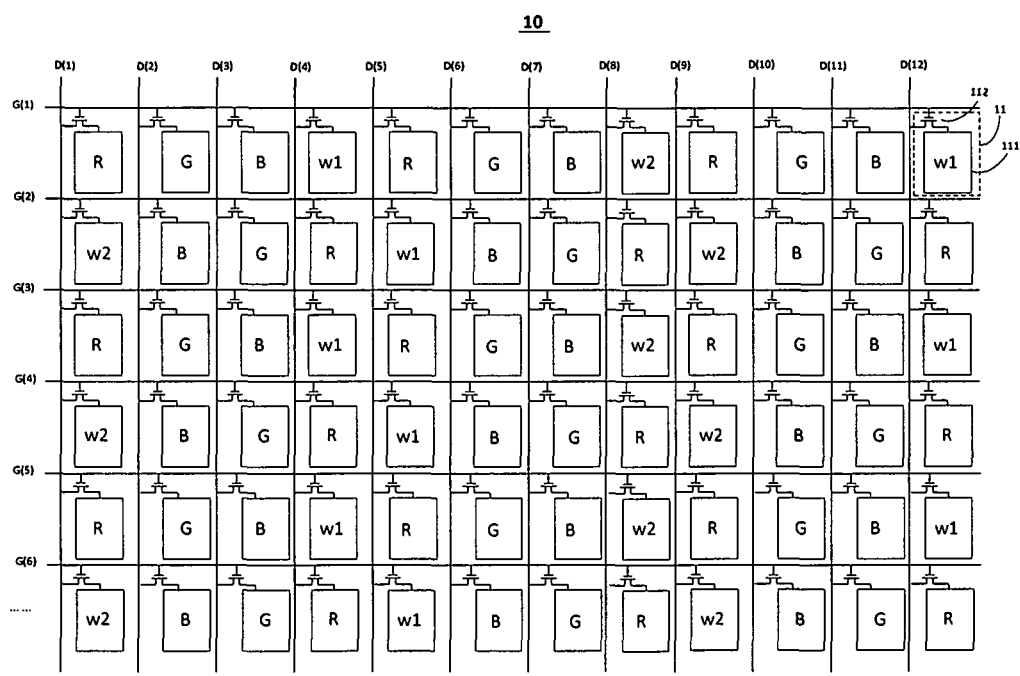
FIG. 2 is a schematic structural view of an RGBW liquid crystal panel according to a first embodiment of the present application.

FIG. 2 is a schematic structural view of an RGBW liquid crystal panel according to a first embodiment of the present application. As shown in FIG. 2, the RGBW liquid crystal panel 10 includes a plurality of scanning lines G(N) (N is a natural number) and a plurality of data lines D(N) (N is a natural number) perpendicular and cross to each other, and a plurality of sub-pixel regions 11 formed by the division of the plurality of scanning lines G(N) and the plurality of data lines D(N).

Wherein, each sub-pixel region 11 includes a sub-pixel 111 and a thin film transistor 112, each gate electrodes and source electrodes of each thin film transistor 112 is connected to a scanning line and a data line, each drain electrodes of each thin film transistor 112 is connected to the sub-pixel 111 in the pixel region 11.

Wherein, the plurality of sub-pixels 111 includes a plurality of first white sub-pixels W1 and a plurality of second white sub-pixels W2. The thin film transistor 112 corresponding to the first white sub-pixel W1 and the thin film transistor 112 corresponding to second white sub-pixel W2 has different channel width-length ratio W/L, so that the first white sub-pixel W1 and the second white sub-pixel W2 are with different luminance.

Specifically, the channel width-length ratio W/L of the thin film transistor 112 corresponding to the first white sub-pixel W1 is the first width-length ratio W1/L1, and the channel width-length ratio W/L of the thin film transistor 112 corresponding to the second white sub-pixel W2 is the second width-length ratio W2/L2, the first width-length ratio W1/L1 is smaller than the second width-length ratio W2/L2, so that the luminance of the first white sub-pixel W1 is smaller than the luminance of the second white sub-pixel W2.

It will be understood by those skilled in the art that from the current leakage of the thin film transistor is $Id=0.5*K*W/L*(V_{gs}-V_{th})^2$ (wherein K, $V_{th}$ are constants associated only with the material of the thin film transistor), it can be known, when the $V_{gs}$ to the thin film transistor is constant, the current leakage Id is only related to t channel width-length ratio W/L of the thin film transistor. The larger the channel width-length ratio W/L is, the larger the current leakage Id is, the larger luminance of the sub-pixel corresponding to the thin film transistor, the smaller the channel width-length ratio W/L is, the smaller the current leakage Id is, the smaller luminance of the sub-pixel corresponding to the thin film transistor, so that, when the channel width-length ratio of the thin film transistor corresponding to the second white sub-pixel W2 is larger than the channel width-length ratio of the thin film transistor corresponding to the first white sub-pixel W1, the luminance of the second white sub-pixel W2 is greater than the luminance of the first white sub-pixel W1.

Figure 3:
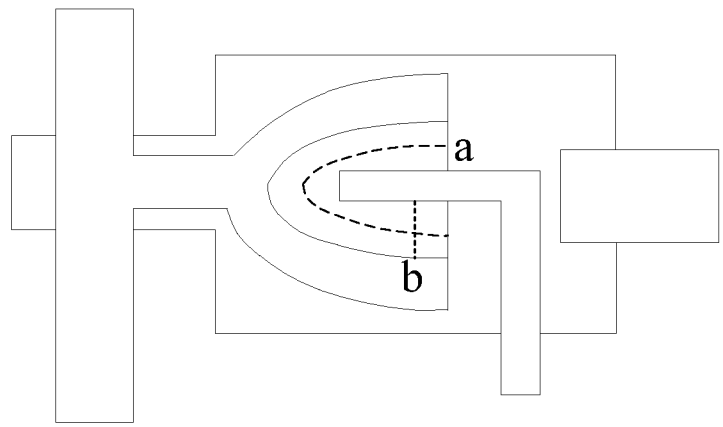
FIG. 3 is a schematic view of a thin film transistor structure in FIG. 2.

Please also referring to FIG. 3, FIG. 3 is a schematic structural view of the thin film transistor of FIG. 2. As shown in FIG. 3, a represents the channel width W of the thin film transistor, and b represents the channel length L of the thin film transistor.

In the present embodiment, the thin film transistor corresponding to the first white sub-pixel W1 and the thin film transistor corresponding to the second white sub-pixel W2 have the same channel lengths, and the channel width of the thin film transistor corresponding to the first white sub-pixel W1 is smaller than the channel width of the thin film transistor corresponding to the second white sub-pixel W2, so that the channel width-length ratio of the thin film transistor corresponding to the first white sub-pixel W1 is smaller than the channel width-length ratio of the thin film transistor corresponding to the second white sub-pixel W2. In other embodiment, when the thin film transistor corresponding to the first white sub-pixel W1 and the thin film transistor corresponding to the second white sub-pixel W2 have the same channel widths, the channel length of the thin film transistor corresponding to the first white sub-pixel W1 is larger than the channel length of the thin film transistor corresponding to the second white sub-pixel W2, it can also achieve the channel width-length ratio of the thin film transistor corresponding to the first white sub-pixel W1 is smaller than the channel width-length ratio of the thin film transistor corresponding to the second white sub-pixel W2, the present application is not limited to this embodiment.

Figure 4:
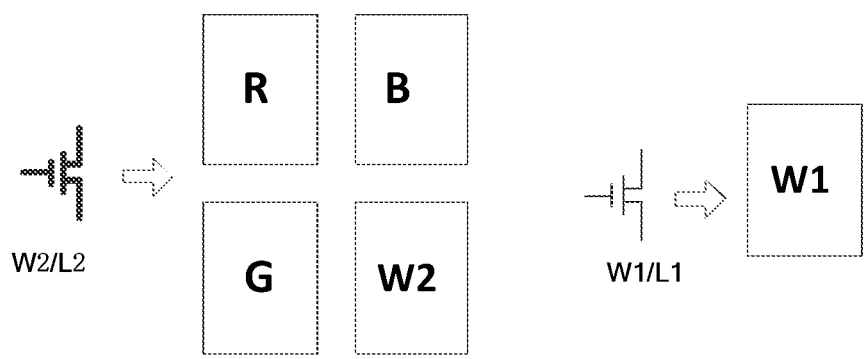
FIG. 4 is a schematic diagram of the thin film transistors have different channel width-length ratios corresponding to the different sub-pixels in FIG. 2.

In the present application, referring to FIG. 4, the plurality of sub-pixels 111 further includes red sub-pixels R, green sub-pixels G, and blue sub-pixels B, wherein channel width-length ratio of the thin film transistors 112 corresponding to the red sub-pixels R, the green sub-pixels G, and the blue sub-pixels B is the second width-length ratio W2/L2.

In the present embodiment, the plurality of sub-pixels 111 in the liquid crystal panel 10 are repeatedly arranged in every two rows, wherein the sub-pixels 111 in the first row and the second row of the two rows are repeatedly arranged in four colors, and the arranged order of the sub-pixels 111 in the first row and the second row are arranged in an opposite order.

In the present embodiment, the sub-pixels 111 in the first row are repeatedly arranged in accordance with the order of a red sub-pixel R, a green sub-pixel G, a blue sub-pixel B, a first white sub-pixel W1, a red sub-pixel R, a green sub-pixel G, a blue sub-pixel B, and the second white sub-pixel W2, the sub-pixels 111 in the second row are repeatedly arranged in accordance with the order of the second white sub-pixel W2, the blue sub-pixel B, the green sub-pixel G, the red sub-pixel R, the first white sub-pixel W1, the blue sub-pixel B, the green sub-pixel G, and the red sub-pixel R.

It will be understood by those skilled in the art that, in the present embodiment, the channel width-length ratio of the thin film transistors corresponding to the red sub-pixel R, the green sub-pixel G, the blue sub-pixel B, and the second white sub-pixel W2 is set to the second width-length ratio W2/L2, the channel width-length ratio of the thin film transistors corresponding to the first white sub-pixel W1 is set to the first width-length ratio W1/L1, so that the overall luminance of the white sub-pixel can be reduced, and thus achieve the effect of improving the effect of darker in a pure color.

In another point of view, in the present embodiment, under the premise of ensuring not changing the other sub-pixel, the channel width-length ratio W/L of the thin film transistor corresponding to a part of the white sub-pixels in the liquid crystal panel is reduced from the second width-length ratio W2/L2 to the first width-length ratio W1/L1, so that the entire luminance of the white sub-pixel can be reduced.

Figure 5:
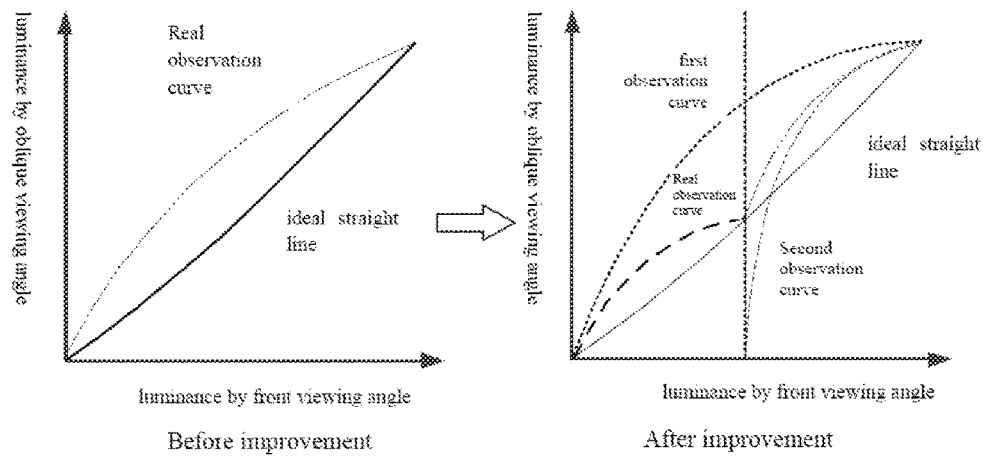
FIG. 5 is a comparison curve of the before and after observation curve when viewing the liquid crystal panel in large viewing angles.

FIG. 5 is a comparison curve of the before and after observation curve when viewing the liquid crystal panel in large viewing angles; as shown in FIG. 5, by comparing the liquid crystal panel before and after the improvement, the observation curve formed by the observed luminance by front viewing angle and the luminance by oblique viewing angle after the improvement is closer to the ideal straight line, that is, having a better display performance by the observation by front viewing.

Wherein, the channel width-length ratio of the thin film transistors corresponding to all of the white sub-pixels in the liquid crystal panel before the improvement are the second width-length ratio W2/L2, the channel width-length ratio of the thin film transistors corresponding to the second white sub-pixels in the liquid crystal panel after the improvement are the second width-length ratio W2/L2, the channel width-length ratio of the thin film transistors corresponding to the first white sub-pixels is the first width-length ratio W1/L1, wherein the first width-length ratio W1/L1 is smaller than the second width-length ratio W2/L2.

Figure 6:
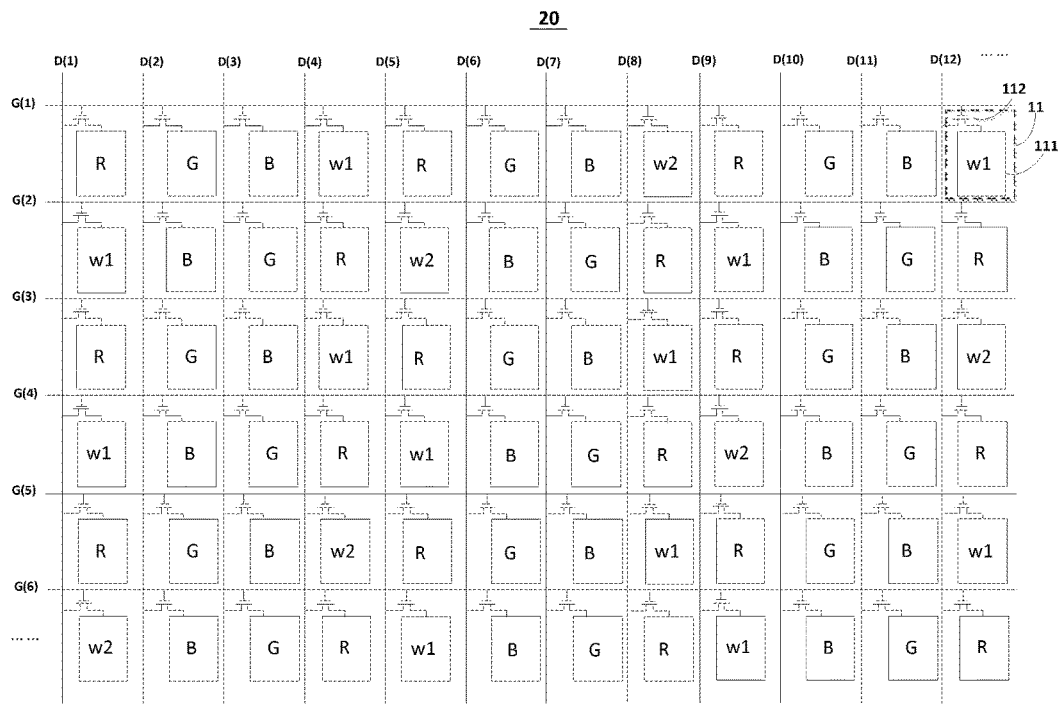
FIG. 6 is a schematic structural view of an RGBW liquid crystal panel according to a second embodiment of the present application.

It will be understood by those skilled in the art that, in the liquid crystal panel after the improvement, since the actual observation curve is a curve formed by stacking the first observation curve and the second observation curve, wherein, the first observation curve is the observation curve corresponding to the liquid crystal panel having the white sub-pixel with the channel width-length ratio is the second width-length ratio W2/L2 of the thin film transistor, the second observation curve is the observation curve corresponding to the liquid crystal panel having the white sub-pixel with the channel width-length ratio is the first width-length ratio W1/L1 of the thin film transistor, the actual observation curve is closer to the ideal straight line. FIG. 6 is a schematic structural view of an RGBW liquid crystal panel according to a second embodiment of the present application. As shown in FIG. 6, the main difference between the RGBW liquid crystal panel 20 shown in FIG. 6 and the RGBW liquid crystal panel 10 shown in FIG. 2 is that:

The plurality of sub-pixels 111 in the liquid crystal panel 20 are repeatedly arranged in every six rows, wherein the sub-pixels 111 in the six rows are repeatedly arranged in four colors, and the arranged order of the sub-pixels 111 in the six rows are different from each other. Preferably, the arranged order of the four colors of the sub-pixels 111 between the first row and the second, between the third row and the fourth row, between the fifth row and the sixth row are arranged in an opposite order, respectively, each row of the sub-pixels 111 in every row simultaneously includes both the first white sub-pixel W1 and the second white sub-pixel W2.

Specifically, in the present embodiment, the sub-pixels 111 in the first row are repeatedly arranged in accordance with the order of the red sub-pixel R, the green sub-pixel G, the blue sub-pixel B, the first white sub-pixel W1, the red sub-pixel R, the green sub-pixel G, the blue sub-pixel B, the second white sub-pixel W2, the red sub-pixel R, the green sub-pixel G, the blue sub-pixel B, and the first white sub-pixel W1; the sub-pixels 111 in the second row are repeatedly arranged in accordance with the order of the first white sub-pixel W1, the blue sub-pixel B, the green sub-pixel G, the red sub-pixel R, the second white sub-pixel W2, the blue sub-pixel B, the green sub-pixel G, the red sub-pixel R, the first white sub-pixel W1, the blue sub-pixel B, the green sub-pixel G, and the red sub-pixel R; the sub-pixels 111 in the third row are repeatedly arranged in accordance with the order of the red sub-pixel R, the green sub-pixel G, the blue sub-pixel B, the first white sub-pixel W1, the red sub-pixel R, the green sub-pixel G, the blue sub-pixel B, the first white sub-pixel W1, the red sub-pixel R, the green sub-pixel G, the blue sub-pixel B, and the second white sub-pixel W2; the sub-pixels 111 in the fourth row are repeatedly arranged in accordance with the order of the first white sub-pixel W1, the blue sub-pixel B, the green sub-pixel G, the red sub-pixel R, the first white sub-pixel W1, the blue sub-pixel B, the green sub-pixel G, the red sub-pixel R, the second white sub-pixel W2, the blue sub-pixel B, the green sub-pixel G, and the red sub-pixel R; the sub-pixels 111 in the fifth row are repeatedly arranged in accordance with the order of the red sub-pixel R, the green sub-pixel G, the blue sub-pixel B, the second white sub-pixel W2, the red sub-pixel R, the green sub-pixel G, the blue sub-pixel B, the first white sub-pixel W1, the red sub-pixel R, the green sub-pixel G, the blue sub-pixel B, and the first white sub-pixel W1; the sub-pixels 111 in the sixth row are repeatedly arranged in accordance with the order of the second white sub-pixel W2, the blue sub-pixel B, the green sub-pixel G, the red sub-pixel R, the first white sub-pixel W1, the blue sub-pixel B, the green sub-pixel G, the red sub-pixel R, the first white sub-pixel W1, the blue sub-pixel B, the green sub-pixel G, and the red sub-pixel R.

Besides the arrangement order of the sub-pixels of the RGBW liquid crystal panel 20 shown in FIG. 6 is different from the RGBW liquid crystal panel 10 shown in FIG. 2, the others are the same, for the simplicity, the other content will not repeat described here.

The advantageous effect of the present application is: the plurality of sub-pixels in the RGBW liquid crystal panel of the present application include the first white sub-pixel and a plurality of second white sub-pixels, wherein, the corresponding thin film transistor of the first white sub-pixel and the corresponding thin film transistor of the second white sub-pixel have different channel width-length ratio, such that the first white sub-pixel and the second white sub-pixel have different brightness. In the above-described manner, the present application can simultaneously improve the problem of darker in a pure color and color shift of the liquid crystal panel, thereby improving the display quality of the liquid crystal panel.

Above are embodiments of the present application, which does not limit the scope of the present application. Any modifications, equivalent replacements or improvements within the spirit and principles of the embodiment described above should be covered by the protected scope of the invention.

What is claimed is:

1. A liquid crystal panel, comprising a plurality of scanning lines and a plurality of data lines perpendicular to and crossing over each other, wherein the plurality of scanning lines and the plurality of data lines divide the liquid crystal panel into a plurality of sub-pixel regions, each of the plurality of sub-pixel regions comprises a sub-pixel and a thin film transistor, a gate electrode and a source electrode of the thin film transistor are connected to one of the plurality of scanning lines and one of the plurality of data lines respectively, a drain electrode of the thin film transistor is connected to the sub-pixel;

sub-pixels of the plurality of sub-pixel regions comprise a plurality of first white sub-pixels and a plurality of second white sub-pixels, the thin film transistor corresponding to each of the plurality of first white sub-pixels and the thin film transistor corresponding to each of the plurality of second white sub-pixels have a different channel width-length ratio, so that the plurality of first white sub-pixels and the plurality of second white sub-pixels have a different luminance;

a channel width-length ratio of the thin film transistor corresponding to each of the plurality of first white sub-pixels is smaller than a channel width-length ratio of the thin film transistor corresponding to each of the plurality of second white sub-pixels;

the thin film transistor corresponding to each of the plurality of first white sub-pixels and the thin film transistor corresponding to each of the plurality of second white sub-pixels have same channel lengths, and a channel width of the thin film transistor corresponding to each of the plurality of first white sub-pixels is smaller than a channel width of the thin film transistor corresponding to each of the plurality of second white sub-pixels; and the sub-pixels of the plurality of sub-pixel regions further comprise a plurality of red sub-pixels, a plurality of green sub-pixels, and a plurality of blue sub-pixels, wherein a channel width-length ratio of the thin film transistors corresponding to the plurality of red sub-pixels, the plurality of green sub-pixels, and the plurality of blue sub-pixels is equal to the channel width-length ratio of the thin film transistor corresponding to each of the plurality of second white sub-pixels.

2. The liquid crystal panel according to claim 1, wherein the sub-pixels in the liquid crystal panel are repeatedly arranged in every two rows;

the sub-pixels in a first row and a second row of the two rows are repeatedly arranged in four colors, and an arranged order of the sub-pixels in the first row is opposite to an arranged order of the sub-pixels in the second row.

3. The liquid crystal panel according to claim 2, wherein the sub-pixels in the first row are repeatedly arranged in an order of one red sub-pixel, one green sub-pixel, one blue sub-pixel, one first white sub-pixel, one red sub-pixel, one green sub-pixel, one blue sub-pixel, and one second white sub-pixel;

the sub-pixels in the second row are repeatedly arranged in an order of one second white sub-pixel, one blue sub-pixel, one green sub-pixel, one red sub-pixel, one first white sub-pixel, one blue sub-pixel, one green sub-pixel, and one red sub-pixel.

4. The liquid crystal panel according to claim 1, wherein the sub-pixels in the liquid crystal panel are repeatedly arranged in every six rows;

the sub-pixels in the six rows are repeatedly arranged in four colors, and arranged orders of the sub-pixels in the six rows are different from each other.

5. The liquid crystal panel according to claim 4, wherein arranged orders of a first row and a second row of the six rows are opposite, arranged orders of a third row and a fourth row of the six rows are opposite, arranged orders of a fifth row and a sixth row of the six rows are opposite;

the sub-pixels of each row of the six rows all comprise at least one of the plurality of first white sub-pixels and at least one of the plurality of second white sub-pixels.

6. The liquid crystal panel according to claim 5, wherein the sub-pixels in the first row are repeatedly arranged in an order of one red sub-pixel, one green sub-pixel, one blue sub-pixel, one first white sub-pixel, one red sub-pixel, one green sub-pixel, one blue sub-pixel, one second white sub-pixel, one red sub-pixel, one green sub-pixel, one blue sub-pixel, and one first white sub-pixel;

the sub-pixels in the second row are repeatedly arranged in an order of one first white sub-pixel, one blue sub-pixel, one green sub-pixel, one red sub-pixel, one second white sub-pixel, one blue sub-pixel, one green sub-pixel, one red sub-pixel, one first white sub-pixel, one blue sub-pixel, one green sub-pixel, and one red sub-pixel;

the sub-pixels in the third row are repeatedly arranged in an order of one red sub-pixel, one green sub-pixel, one blue sub-pixel, one first white sub-pixel, one red sub-pixel, one green sub-pixel, one blue sub-pixel, one first white sub-pixel, one red sub-pixel, one green sub-pixel, one blue sub-pixel, and one second white sub-pixel;

the sub-pixels in the fourth row are repeatedly arranged in an order of one first white sub-pixel, one blue sub-pixel, one green sub-pixel, one red sub-pixel, one first white sub-pixel, one blue sub-pixel, one green sub-pixel, one red sub-pixel, one second white sub-pixel, one blue sub-pixel, one green sub-pixel, and one red sub-pixel;

the sub-pixels in the fifth row are repeatedly arranged in an order of one red sub-pixel, one green sub-pixel, one blue sub-pixel, one second white sub-pixel, one red sub-pixel, one green sub-pixel, one blue sub-pixel, one first white sub-pixel, one red sub-pixel, one green sub-pixel, one blue sub-pixel, and one first white sub-pixel;

the sub-pixels in the sixth row are repeatedly arranged in an order of one second white sub-pixel, one blue sub-pixel, one green sub-pixel, one red sub-pixel, one first white sub-pixel, one blue sub-pixel, one green sub-pixel, one red sub-pixel, one first white sub-pixel, one blue sub-pixel, one green sub-pixel, and one red sub-pixel.

7. A liquid crystal panel, comprising a plurality of scanning lines and a plurality of data lines perpendicular to and crossing over each other, wherein the plurality of scanning lines and the plurality of data lines divide the liquid crystal panel into a plurality of sub-pixel regions, each of plurality of the sub-pixel regions comprises a sub-pixel and a thin film transistor, a gate electrode and a source electrode of the thin film transistor are connected to one of the plurality of scanning lines and one of the plurality of data lines respectively, a drain electrode of the thin film transistor is connected to the sub-pixel;

sub-pixels of the plurality of sub-pixel regions comprise a plurality of first white sub-pixels and a plurality of second white sub-pixels, the thin film transistor corresponding to each of the plurality of first white sub-pixels and the thin film transistor corresponding to each of the plurality of second white sub-pixels have a different channel width-length ratio, so that the plurality of first white sub-pixels and the plurality of second white sub-pixels have a different luminance.

8. The liquid crystal panel according to claim 7, wherein a channel width-length ratio of the thin film transistor corresponding to each of the plurality of first white sub-pixels is smaller than a channel width-length ratio of the thin film transistor corresponding to each of the plurality of second white sub-pixels.

9. The liquid crystal panel according to claim 8, wherein the thin film transistor corresponding to each of the plurality of first white sub-pixels and the thin film transistor corresponding to each of the plurality of second white sub-pixels have same channel lengths, and a channel width of the thin film transistor corresponding to each of the plurality of first white sub-pixels is smaller than a channel width of the thin film transistor corresponding to each of the plurality of second white sub-pixels.

10. The liquid crystal panel according to claim 8, wherein the thin film transistor corresponding to each of the plurality of first white sub-pixels and the thin film transistor corresponding to each of the plurality of second white sub-pixels have same channel widths, and a channel length of the thin film transistor corresponding to each of the plurality of first white sub-pixels is larger than a channel length of the thin film transistor corresponding to each of the plurality of second white sub-pixels.

11. The liquid crystal panel according to claim 8, wherein the sub-pixels of the plurality of sub-pixel regions further comprise a plurality of red sub-pixels, a plurality of green sub-pixels, and a plurality of blue sub-pixels, wherein a channel width-length ratio of the thin film transistors corresponding to the plurality of red sub-pixels, the plurality of green sub-pixels, and the plurality of blue sub-pixels is equal to the channel width-length ratio of the thin film transistor corresponding to each of the plurality of second white sub-pixels.

12. The liquid crystal panel according to claim 11, wherein
the sub-pixels in the liquid crystal panel are repeatedly arranged in every two rows;
the sub-pixels in a first row and a second row of the two rows are repeatedly arranged in four colors, and an arranged order of the sub-pixels in the first row is opposite to an arranged order of the sub-pixels in the second row.

13. The liquid crystal panel according to claim 12, wherein
the sub-pixels in the first row are repeatedly arranged in an order of one red sub-pixel, one green sub-pixel, one blue sub-pixel, one first white sub-pixel, one red sub-pixel, one green sub-pixel, one blue sub-pixel, and one second white sub-pixel;
the sub-pixels in the second row are repeatedly arranged in an order of one second white sub-pixel, one blue sub-pixel, one green sub-pixel, one red sub-pixel, one first white sub-pixel, one blue sub-pixel, one green sub-pixel, and one red sub-pixel.

14. The liquid crystal panel according to claim 11, wherein
the sub-pixels in the liquid crystal panel are repeatedly arranged in every six rows;
the sub-pixels in the six rows are repeatedly arranged in four colors, and arranged orders of the sub-pixels in the six rows are different from each other.

15. The liquid crystal panel according to claim 14, wherein
arranged orders of a first row and a second row of the six rows are opposite, arranged orders of a third row and a fourth row of the six rows are opposite, arranged orders of a fifth row and a sixth row of the six rows are opposite;
the sub-pixels of each row of the six rows all comprise at least one of the plurality of first white sub-pixels and at least one of the plurality of second white sub-pixels.

16. The liquid crystal panel according to claim 15, wherein
the sub-pixels in the first row are repeatedly arranged in an order of one red sub-pixel, one green sub-pixel, one blue sub-pixel, one first white sub-pixel, one red sub-pixel, one green sub-pixel, one blue sub-pixel, one second white sub-pixel, one red sub-pixel, one green sub-pixel, one blue sub-pixel, and one first white sub-pixel;
the sub-pixels in the second row are repeatedly arranged in an order of one first white sub-pixel, one blue sub-pixel, one green sub-pixel, one red sub-pixel, one second white sub-pixel, one blue sub-pixel, one green sub-pixel, one red sub-pixel, one first white sub-pixel, one blue sub-pixel, one green sub-pixel, and one red sub-pixel;
the sub-pixels in the third row are repeatedly arranged in an order of one red sub-pixel, one green sub-pixel, one blue sub-pixel, one first white sub-pixel, one red sub-pixel, one green sub-pixel, one blue sub-pixel, one first white sub-pixel, one red sub-pixel, one green sub-pixel, one blue sub-pixel, and one second white sub-pixel;
the sub-pixels in the fourth row are repeatedly arranged in an order of one first white sub-pixel, one blue sub-pixel, one green sub-pixel, one red sub-pixel, one first white sub-pixel, one blue sub-pixel, one green sub-pixel, one red sub-pixel, one second white sub-pixel, one blue sub-pixel, one green sub-pixel, and one red sub-pixel;
the sub-pixels in the fifth row are repeatedly arranged in an order of one red sub-pixel, one green sub-pixel, one blue sub-pixel, one second white sub-pixel, one red sub-pixel, one green sub-pixel, one blue sub-pixel, one first white sub-pixel, one red sub-pixel, one green sub-pixel, one blue sub-pixel, and one first white sub-pixel;
the sub-pixels in the sixth row are repeatedly arranged in an order of one second white sub-pixel, one blue sub-pixel, one green sub-pixel, one red sub-pixel, one first white sub-pixel, one blue sub-pixel, one green sub-pixel, one red sub-pixel, one first white sub-pixel, one blue sub-pixel, one green sub-pixel, and one red sub-pixel.

* * * * *